US008928383B2

(12) United States Patent
Goswami et al.

(10) Patent No.: US 8,928,383 B2
(45) Date of Patent: Jan. 6, 2015

(54) INTEGRATED DELAYED CLOCK FOR HIGH SPEED ISOLATED SPI COMMUNICATION

(71) Applicants: Bikiran Goswami, Norwood, MA (US); Mark Stewart Cantrell, Windham, NH (US); Baoxing Chen, Westford, MA (US)

(72) Inventors: Bikiran Goswami, Norwood, MA (US); Mark Stewart Cantrell, Windham, NH (US); Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/841,130

(22) Filed: Mar. 15, 2013

(65) Prior Publication Data

US 2014/0266373 A1 Sep. 18, 2014

(51) Int. Cl.
*H03K 5/13* (2014.01)
*H03K 3/011* (2006.01)

(52) U.S. Cl.
CPC ................................ *H03K 3/011* (2013.01)
USPC ........................................................ 327/257

(58) Field of Classification Search
CPC . H04L 25/0266; H04L 7/0008; H04L 7/0033; H04L 7/0037; H03K 3/011; H03K 3/86; G06F 1/10
USPC .................................................. 375/257–258
See application file for complete search history.

(56) References Cited

U.S. PATENT DOCUMENTS

| 4,388,716 | A  | * | 6/1983  | Takezoe et al. ............... 370/294 |
|---|---|---|---|---|
| 5,500,895 | A  | * | 3/1996  | Yurgelites ..................... 379/412 |
| 5,555,438 | A  |   | 9/1996  | Blech et al. |
| 5,952,849 | A  |   | 9/1999  | Haigh |
| 6,094,377 | A  | * | 7/2000  | Roohparvar et al. .... 365/189.05 |
| 6,291,907 | B1 |   | 9/2001  | Haigh et al. |
| 6,301,633 | B1 | * | 10/2001 | Chapman ...................... 710/305 |
| 6,404,780 | B1 | * | 6/2002  | Laturell et al. ................ 370/510 |
| 6,788,754 | B1 | * | 9/2004  | Liepe ............................ 375/375 |
| 6,853,685 | B1 | * | 2/2005  | Konrad ......................... 375/258 |
| 6,873,065 | B2 |   | 3/2005  | Haigh et al. |
| 6,903,578 | B2 |   | 6/2005  | Haigh et al. |
| 7,075,329 | B2 |   | 7/2006  | Chen et al. |
| 7,719,305 | B2 |   | 5/2010  | Chen |
| 7,733,127 | B2 | * | 6/2010  | Wingen .......................... 326/80 |
| 7,755,400 | B2 |   | 7/2010  | Jordanger et al. |
| 7,825,652 | B2 | * | 11/2010 | Miller ........................ 324/750.3 |
| 8,514,952 | B2 | * | 8/2013  | Zerbe ............................ 375/257 |
| 2002/0091958 | A1 |   | 7/2002  | Schoenfeld et al. |
| 2004/0036808 | A1 |   | 2/2004  | Lendaro |
| 2004/0150426 | A1 |   | 8/2004  | Zhu et al. |
| 2005/0259692 | A1 | * | 11/2005 | Zerbe ............................ 370/503 |

(Continued)

OTHER PUBLICATIONS

Analog Devices, Inc., "Quad Isolated Precision Gate Driver, 0.1 A Output", ADuM1420, Rev. A, pp. 1-12, Feb. 2008.

(Continued)

*Primary Examiner* — Thomas J Hiltunen
(74) *Attorney, Agent, or Firm* — Kenyon & Kenyon LLP

(57) ABSTRACT

A system may include a plurality of isolators to transfer data signals across an isolation barrier, one of the signals including a clock signal. A delay circuit may be included to receive the clock signal and provide a delayed clock signal that lags the clock signal by an amount representing a delay across the isolation barrier. The delayed clock signal may be delayed by a round trip propagation delay over the isolation barrier. The delayed clock signal may be used as a reference to read data sent over the isolation barrier.

26 Claims, 4 Drawing Sheets

(56) References Cited

U.S. PATENT DOCUMENTS

| | | | |
|---|---|---|---|
| 2008/0279288 A1* | 11/2008 | Crawley et al. | 375/244 |
| 2010/0150338 A1 | 6/2010 | Nguyen | |
| 2010/0250820 A1 | 9/2010 | Gaalaas et al. | |
| 2010/0268906 A1 | 10/2010 | Gillingham et al. | |
| 2010/0271092 A1* | 10/2010 | Zerbe et al. | 327/161 |

OTHER PUBLICATIONS

Analog Devices, Inc., "Dual-Channel Digital Isolators, 5 kV", ADuM2200/ADuM2201, Rev E, pp. 1-20, Jan. 2008.

Analog Devices, Inc., "High Speed, ESD-Protected, Half-/Full-Duplex iCoupler Isolated RS-485 Transceiver", ADM2491E, Rev. B, pp. 1-16, Oct. 2007.

Analog Devices, Inc., "Isolated Sigma-Delta Modulator", AD7400A, Rev. D, pp. 1-20, May 2008.

Analog Devices, Inc., "Isolated Sigma-Delta Modulator", AD7401A, Rev. C, pp. 1-20, Jul. 2008.

Analog Devices, Inc., "Functional SPI Isolation", Sep. 2011.

Ott, H.W. "Noise Reduction Techniques in Electronic Systems", New York, NY: John Wiley & Sons, 1988, pp. 73-115.

Cantrell, M. "Clocking Options for SPI", Mar. 2008.

Baoxing Chen, "Inside iCoupler Technology", Mar. 2008.

Analog Devices, Inc., "16-Bit, 250 kSPS PulSAR ADC in MSOP/QFN", AD7685, Rev. B, pp. 1-28, Apr. 2004.

Kugelstadt, T., "New digital, capacitive isolators raise the bar in high-performance," Texas Instruments, EE Times Design online date Apr. 6, 2010, pp. 1-5.

Extended European Search Report and Search Opinion in counterpart European application No. 14158117.3, communication dated May 9, 2014.

* cited by examiner

100

200
NOT TO SCALE

400

INTEGRATED DELAYED CLOCK FOR HIGH SPEED ISOLATED SPI COMMUNICATION

BACKGROUND

The subject matter of this application is directed to serial communication, and more particularly to isolated Serial Peripheral Interface Bus (SPI) communication.

SPI communication involves sending data one bit at a time, sequentially, over a communication channel. Devices using SPI communication operate in a master/slave configuration where the master device initiates the communication with one or more slave devices. Data is moved between the master device and the slave device based on a clock signal generated by the master device. Using the clock signal as a reference, the master device sends one bit of data at a time to the slave device. The slave device reads the bits of data sent by the master device and sends one bit of data at a time back to the master device. Using the generated clock signal as the reference, the master device reads the bits of data sent by the slave device.

Typically, the master device and the slave device send data over the communication channel on one transition (e.g., rising edge) of the clock and read the data in the opposite transition (e.g., falling edge) of the clock. Accordingly, the clock generated by the master device determines the maximum bandwidth of the communication between the devices. However, propagation delay associated with sending the data from the master device to the slave device and the propagation delay associated with sending the data from the slave device to the master device place limits on the speed of the communication. If the round trip propagation delay approaches or exceeds half of the clock period, it may be necessary to reduce the clock speed, thus reducing the communication bandwidth.

The bandwidth is further reduced when isolation devices are used as part of the communication channel in an isolated SPI implementation. The additional delay associated with the isolation devices, which in some cases may be the dominant delay component between the master and slave devices, present significant challenge to system designers who need high system bandwidth. Methods have been proposed to generate a reference clock synchronous with the returning data on the side of the slave device which is sent over the isolation channel. However, these methods use additional isolation channels to send the reference clock, which consume space and power in the system.

Accordingly, there is a need in the art for high-speed isolated SPI communication systems and methods.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

DETAILED DESCRIPTION

Embodiments of the present disclosure may provide a high-speed isolated SPI communication systems and methods. A system may include a plurality of isolators to transfer data signals across an isolation barrier, one of the signals including a clock signal. A delay circuit may be included to receive the clock signal and provide a delayed clock signal that lags the clock signal by an amount representing a delay across the isolation barrier. The delayed clock signal may be delayed by a round trip propagation delay over the isolation barrier. The delayed clock signal may be used as a reference to read data sent over the isolation barrier.

Figure 1:
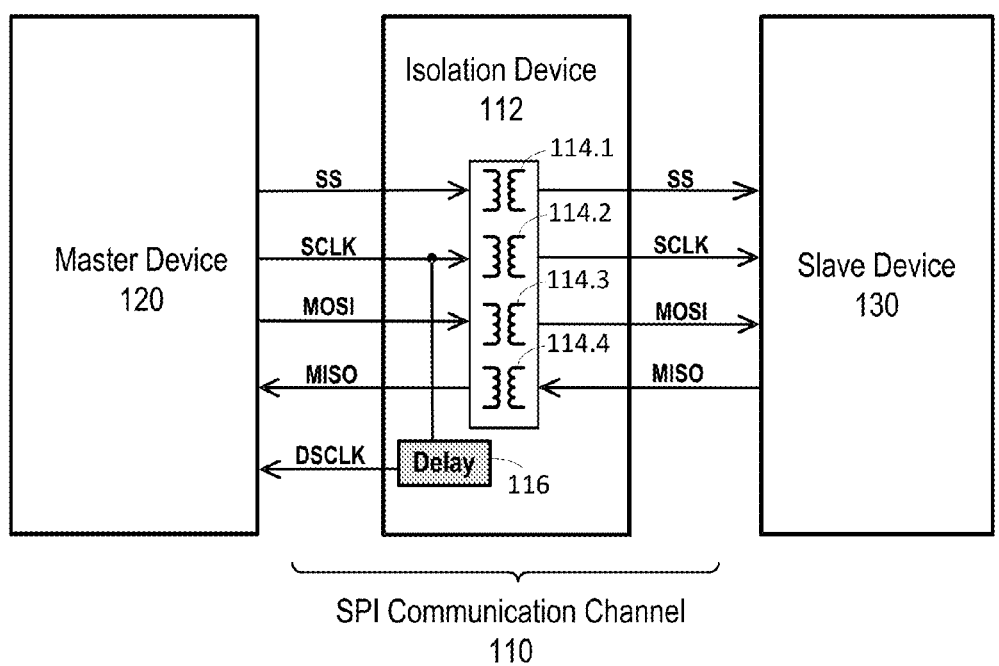
FIG. 1 illustrates an isolated a master/slave SPI communication system according to an embodiment of the present invention.

FIG. 1 illustrates an isolated a master/slave SPI communication system 100 according to an embodiment of the present invention. The communication system 100 may include an SPI communication channel 110 over which the master device 120 and the slave device 130 communicate. The communication channel 110 may include an isolation device 112 to provide isolation between the master device 120 and the slave device 130. The isolation device 112 may include a plurality of isolators 114.1-114.4 to couple the master device 120 to the slave device 130 and a delay circuit 116 to provide a delayed clock signal DSCLK of the clock signal SCLK to the master device 120. The isolators 114.1-114.4 may include one or more of transformers, capacitors, opto-electronic and magneto-resistive based isolation devices.

The master device 120 may include inputs and outputs coupled to respective inputs and outputs of the slave device 130 via data lines and the isolation device 112 of the communication channel 110. The data lines between the master device 120 and the slave device may include a slave select (SS) data line, a serial clock (SCLK) data line, a master-output-slave-input (MOSI) data line, and a master-input-slave-output (MISO) data line. A delayed clock (DSCLK) data line may be included between the master device 120 and the isolation device 112.

To communicate with the slave device 130, the master device 120 may send a slave select signal over the SS data line to select the slave device 130. In one embodiment, the slave device 130 may be selected in response to a logic low signal or a falling edge.

The master device 120 also may generate and send a clock signal over the SCLK data line to the slave device 130. The clock signal SCLK may be used by the master device 120 and the slave device 130 as a reference to send and/or receive data over the MOSI and MISO data lines. For example, in each clock cycle of the clock signal SCLK, the master device 120 may send a bit of data to the slave device 130 over the MOSI data line and the slave device 130 may send a bit of data to the master device 120 over the MISO data line. The master device 120 and the slave device 130 may send data over the communication channel 110 on one transition (e.g., rising edge) of the clock and read data from the communication channel 110 on the opposite transition (e.g., falling edge) of the clock SCLK. In other embodiments, the same type of transitions (e.g., one of the rising and falling edges) may be used as a reference to send and receive data over the communication channel 110. As will be discussed in more detail below, the master device 120 may read the data from the communication channel 110 using the delayed clock DSCLK as the reference (e.g., using one of the rising and falling edges). Thus, the frequency of the clock signal SCLK may determine the bandwidth of the communication between the master device 120 and the slave device 130.

The isolation device 112 may provide an isolation barrier between the master device 120 and the slave device 130. The isolation barrier may define separate voltage domains for the master device 120 and the slave device 130, including separate voltage supplies and grounds.

The isolation device 112 may provide a plurality of isolation channels between a first side of the isolation barrier and a second side of the isolation barrier formed by the isolators 114.1-114.4. The isolation device 112 may include a first set of connections on the first side of the isolation barrier formed by the isolators 114.1-114.4. The first set of connections may be used to receive and send signals to the master device 120. A second set of connections may be provided on the second side of the isolation barrier formed by the isolators 114.1-114.4. The second set of connections may be used for sending signals to the slave device 130 and receiving signals from the slave device 130. In the embodiment illustrated in FIG. 1, the isolators 114.1-114.4 may support unidirectional communication between the first side of the isolation barrier and the second side of the isolation barrier. Each of the data lines may be coupled to a separate isolator 114.1-114.4. Other embodiments may include bidirectional communication (not shown in FIG. 1) over one or more isolation channels. While not shown in FIG. 1, the isolation device 112 may include circuitry to encode and/or decode signals transferred across the isolation barrier. Each isolator 114.1-114.4 may include an encoder on one side and a decoder on the other side of the isolation barrier.

The isolation device 112, shown in FIG. 1, may include a delay circuit 116 to provide a delayed clock DSCLK to the master device 120. The delayed clock DSCLK provides a reference for the master device 120 to read the data received from the slave device 130. The delayed clock DSCLK may be provided at a same frequency of the clock SCLK but may lag the clock SCLK by a predetermined delay. Generating the clock on the master side of the isolation barrier allows the delay circuit 116 to generate an accurate clock signal without requiring complicated coding and decoding circuits that may be used when the clock signal is obtained from the side of the isolation barrier with the slave device 130. The delay circuit 116 may be fabricated on a common integrated chip as the isolators 114.1-114.4.

Figure 2:
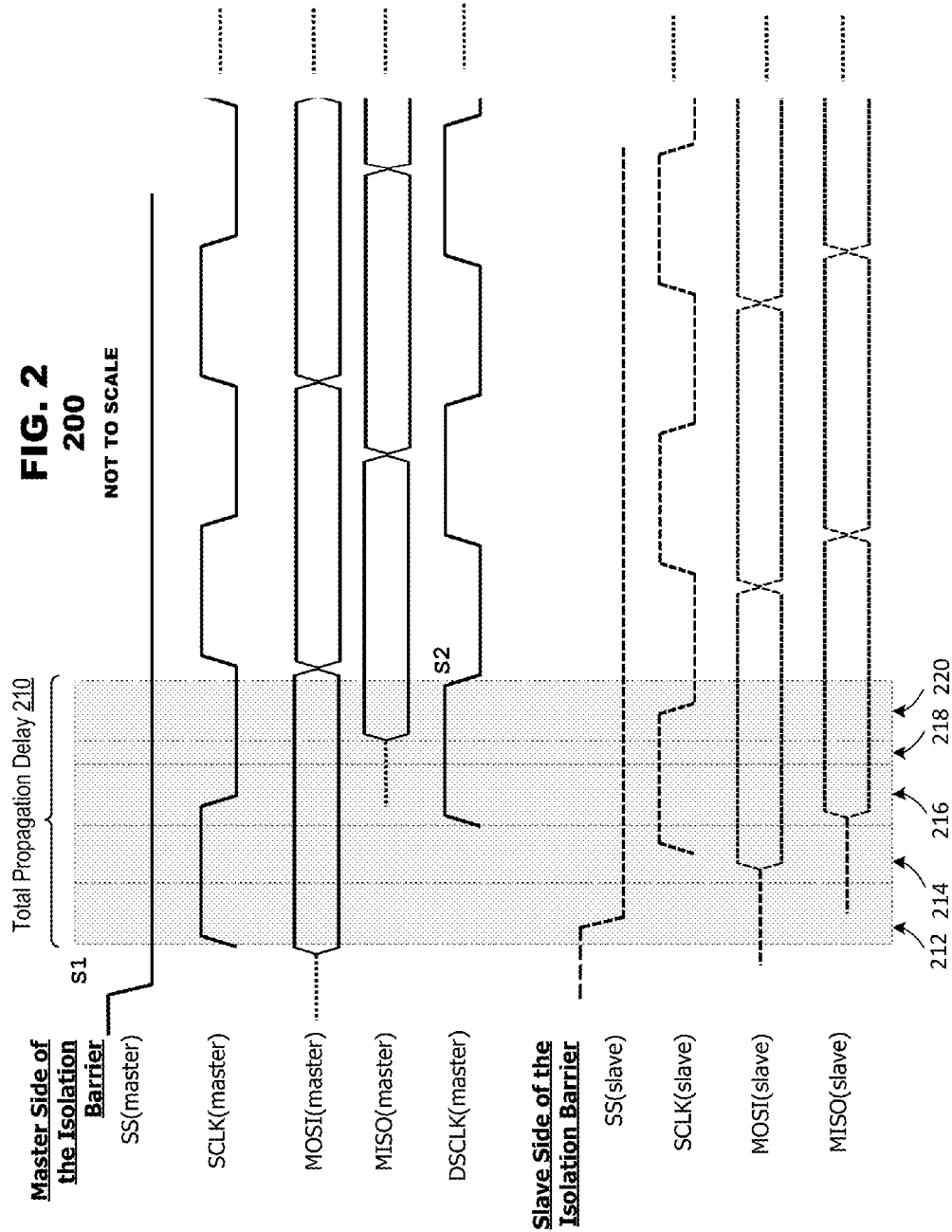
FIG. 2 illustrates exemplary data signals that may be exchanged between the master device and the slave device according to an embodiment of the present invention.

FIG. 2 illustrates exemplary data signals 200 that may be exchanged between the master side of the isolation barrier and the slave side of the isolation barrier according to an embodiment of the present disclosure. FIG. 2 illustrates the timing of signals that are sent and received by the master device 120 and the slave device 130 with reference to the propagation delay 210 of the isolated SPI communication system shown in FIG. 1. As shown in FIG. 2, the master device 120 uses the clock SCLK as a reference to send data to the slave device and uses the delayed clock DSCLK as a reference to read the data from the slave device. Because the master device 120 uses different clock signals to send and read data, the clock SCLK and the bandwidth of the system can be increased as compared to conventional systems. Using a different clock signal (e.g., delayed clock DSCLK) for reading the data from the channel by the master device 120, allows for the constraint that data must be available based on the master clock (e.g., clock SCLK) to be removed.

The propagation delay 210 may be due to a number of factors at the master device 120, isolation device 112 and slave device 130. The propagation delay 210 may include but is not limited to, isolation device delay from the master to slave direction 212, isolation device delay from the slave to master direction 214, clock trace delay 216, master side delay 218 and slave side delay 220. Each delay may change based on the operating parameters and/or conditions of the devices. The round trip propagation delay of the isolation device 112 may include the isolation device delay from the master to slave direction 212 and the isolation device delay from the slave to master direction 214. The round trip propagation delay of the isolation device 112 may correspond to the propagation delay of data sent over the MOSI data line in a first direction and the propagation delay of data sent over the MISO data line in the opposite direction. The isolation device delay from the master to slave direction 212 may include the delays associated with encoding the data sent by the master device over the isolation channel, sending the encoded data over the corresponding isolator, and decoding the encoded dada. The isolation device delay from the slave to master direction 214 may include the delays associated with encoding the data sent by the slave device over the isolation channel, sending the encoded data over the corresponding isolator, and decoding the encoded dada. The delay caused by each channel including respective isolators 114.1-114.4 may be different due to the varying characteristics of the isolators 114.1-114.4 and/or the associated circuitry. The master side delay 218 and the slave side delay 220 may include delays that are caused by components or conditions outside of the isolation device 112.

As shown in FIG. 2, the master device may send the data MOSI (master) to the slave device at a first edge S1 (e.g., rising edge) of the clock SCLK and may read the data MISO (master) sent by the slave device at a second edge S2 (e.g., falling edge) of the delayed clock signal DSCLK. The slave device 130 may receive the data MOSI (slave) from the master device 120 along with the clock signal SCLK (slave) and send data MISO (slave) to the master device 120. The master device 120 is able to read the data MISO (master) received by from the slave device 130 if the data MISO (master) is received before the second edge S2 of the delayed clock signal DSCLK.

The delayed clock signal DSCLK is shown lagging the clock signal SCLK by a portion of the total propagation delay 210. As shown in FIG. 2, the delayed clock signal DSCLK may lag the clock signal SCLK by a round trip propagation delay due to the isolation device 112. The round trip propagation delay may include the delay in the isolation device 112 from the master to slave direction 212 and the delay in the isolation device 112 from the slave to master direction 214. The propagation delay that is not due to the round trip propagation delay of the isolation device 112 (e.g., clock trace delay 216, master side delay 218 and slave side delay 220) may be used to set the frequency of the clock signal SCLK. This propagation delay outside of the isolation device 112 may be used to set the half cycle of the clock SCLK.

The delay produced by the delay circuit 116 for the clock SCLK may be set to at least the round trip propagation delay due to the isolation device 112. The round trip propagation delay may include at least the delay in the isolation device 112 from the master to slave direction 212 and the delay in the isolation device from the slave to master direction 214. If the delay due to the isolation device in both directions is approximately the same, the delay produced by the delay circuit 116 for the clock SCLK may be set to at least twice the delay of the isolators 114.1-114.4 in one direction.

Including the delay circuit 116 allows for the frequency of the clock SCLK and thus, the bandwidth to be increased. Unlike other efforts to provide an additional clock signal that is routed from the slave side of the isolation barrier to the master side of the isolation barrier, the embodiment shown in FIG. 1 does not need an additional isolation channel and/or additional encoder and decoder circuits to provide the additional clock signal. The embodiment shown in FIG. 1 simplifies the isolation device 112 because there is no need for the additional isolation channels, that may need to be well matched to other isolation channels, and no need for complex encoder and decoder circuits. Thus, the embodiment shown in FIG. 1 may provide for area and power efficient systems.

The delay provided by the delay circuit 116 may be preset based on the characteristics of the isolation device 112. For example, the delay circuit 116 may include trimmed delay elements that are programmed during production testing. The delay provided by the delay circuit 116 may be dynamically adjusted based on the operating parameter of the isolation device 112. Dynamically adjusting the delay may compensate for variances in the propagation delay of the system due to changes in the operation conditions. For example, the delay circuit 116 may include a circuit to monitor the power supply on the master side of the isolation barrier and/or power supply on the slave side of the isolation barrier and to set the delay based on changes in their values. Monitoring the variations in the power supply on a side of the isolation barrier may provide the variations in the propagation delay on the corresponding side of the isolation barrier. In other embodiments, the delay circuit 116 may monitor the temperature variations in one or more locations of the system (e.g., one of the sides of the isolation barrier in the isolation device 112) and adjust the delay of the delayed clock DSCLK based on the changes in the temperature.

While in FIG. 2, a rising edge of the clock SCLK is used as a reference to send data and a falling edge of the delayed clock DSCLK is used as a reference to receive data from the communication channel, other configurations of the clock SCLK and the delayed clock DSCLK could be used to send and receive data over the communication channel. For example, only the rising edges of both the clock SCLK and the delayed clock DSCLK could be used as a reference to send and receive data over the communication channel. In other embodiments, only the falling edges of both the clock SCLK and the delayed clock DSCLK could be used as a reference to send and receive data over the communication channel.

Figure 3:
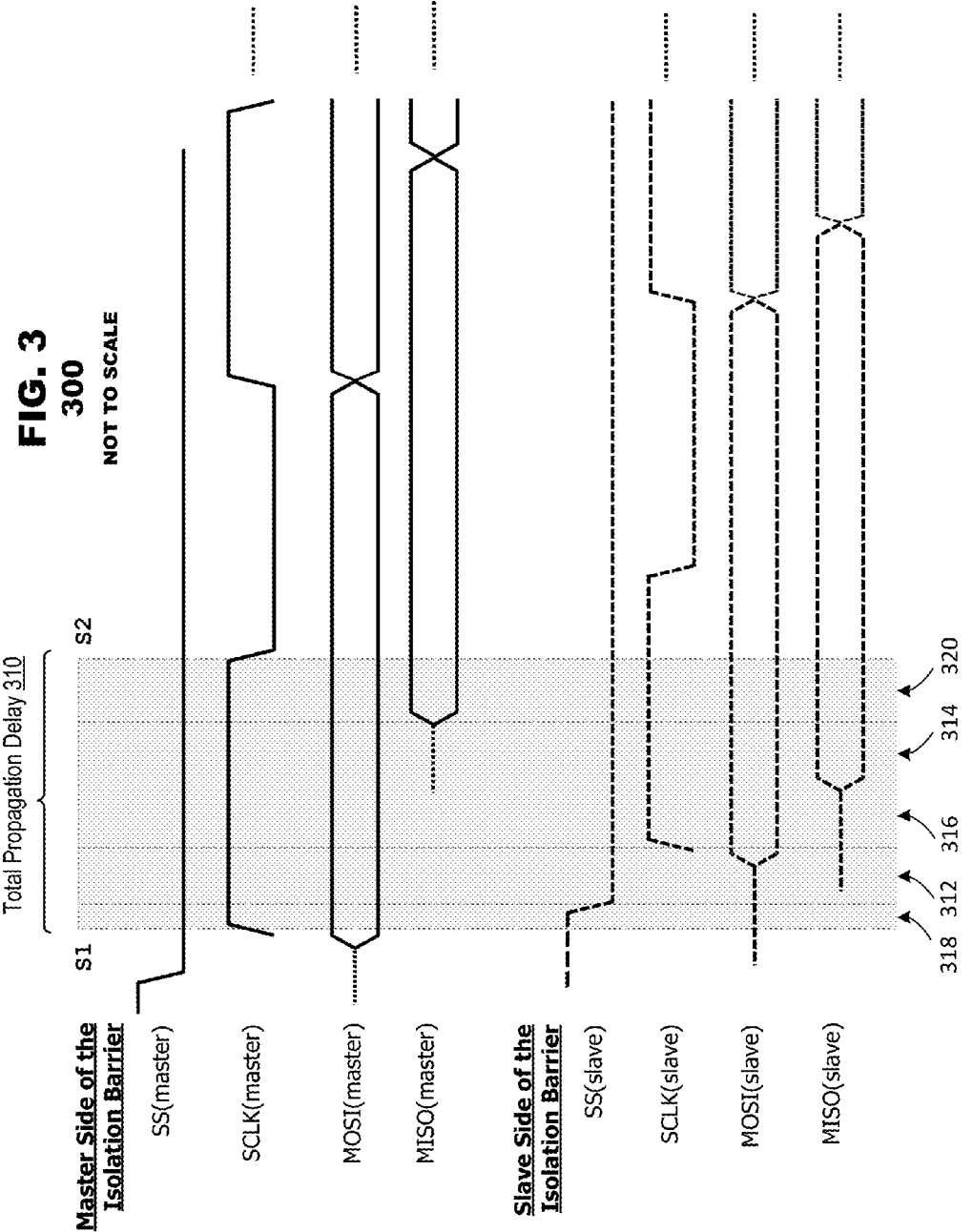
FIG. 3 illustrates exemplary data signals that may be exchanged between a master device and a slave device.

FIG. 3 illustrates exemplary data signals that may be exchanged between a master device and a slave device without a delay circuit shown in FIG. 1. FIG. 3 illustrates the timing of signals that are sent and received by the master device and the slave device with reference to the propagation delay 310 of an isolated SPI communication system. As shown in FIG. 3, because the frequency of the clock signal SCLK is based on the total propagation delay 310, the propagation delay 310 of the system places restrictions on the bandwidth of the communication system. As compared to the frequency of the clock SCLK shown in FIG. 2, the frequency of the clock SCLK shown in FIG. 3 is reduced because the clock SCLK is used by the master device as a reference to both send and receive data over the communication channel.

The propagation delay 310 may include isolation device delay from the master to slave direction 312, isolation device delay from the slave to master direction 314, clock trace delay 320, master side delay 318 and slave side delay 316. Each delay may change based on the operating parameters and/or conditions of the devices.

As shown in FIG. 3, the master device sends the data to the slave device at a first edge S1 (e.g., rising edge) of the clock SCLK and reads the data sent by the slave device at a second edge S2 (e.g., falling edge) of the clock signal SCLK. In order for the master device to be able to read the data coming in on the MISO data line at the second edge S2 of the clock signal SCLK, the clock SCLK needs to be set such that a half cycle of the clock SCLK is at least equal to the propagation delay 310 (i.e., round-trip propagation of the data must occur in half of the clock SCLK cycle). This ensures that the data from the slave device MISO (slave) is received at the master device MISO (master) before the second edge S2 of the clock SCLK. As shown in FIG. 3, the delay caused by the isolation device causes the frequency of the clock to be significantly limited.

While in FIG. 3 the half cycle of the clock SCLK is set to at least the propagation delay 310, the half cycle of the clock SCLK in FIG. 2 may be decreased and set to only a portion of the total propagation delay 210. For example, the half cycle of the clock SCLK may be set to the master side delay 312, the clock trace delay 316 and the slave side delay 320. Furthermore, the half cycle of the clock SCLK of the embodiment shown in FIG. 1 may be adjusted based on the operating requirements of the system.

Providing the delayed clock DSCLK to the mater device 120 to be used as a reference to read the data from the communication channel allows for the penalty of the delay caused by the isolation device 112 to be removed from the system. Using the system shown in FIG. 1, the frequency of the clock signal SCLK may be limited by only the propagation delays caused by components and/or conditions outside of the isolation device 112.

Figure 4:
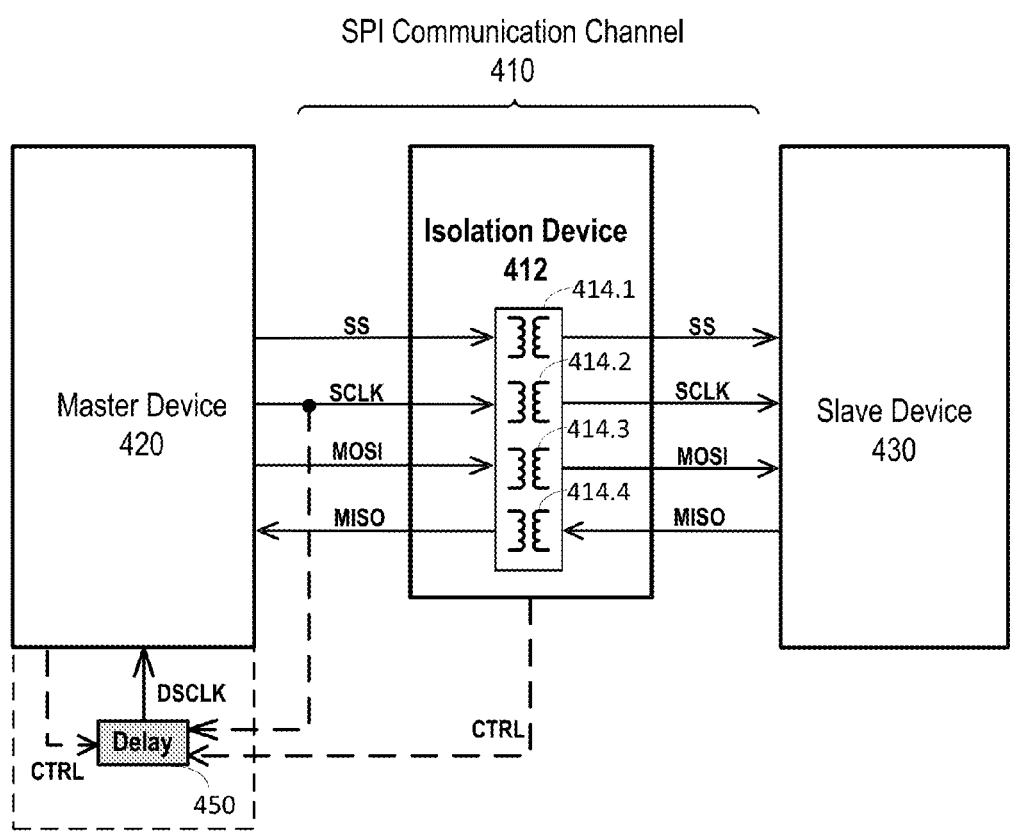
FIG. 4 illustrates an isolated a master/slave SPI communication system according to another embodiment of the present invention.

FIG. 4 illustrates an isolated a master/slave SPI communication system 400 according to another embodiment of the present disclosure. The communication system 400 may include a master device 420 and a slave device 430 that communicate over an SPI communication channel 410. The master device 420 may provide a clock signals SCLK to control movement of data and a delay circuit 450 may provide a delayed clock signal DSCLK to the master device 120 to control the sampling of the data received by the master device 420. The communication channel 410 may include an isolation device 412 to provide isolation between the master device 420 and the slave device 430. The isolation device 412 may include a plurality of isolators 414 to couple the master device 420 to the slave device 430.

The embodiment shown in FIG. 4 may include a delay circuit 450 that is provided outside of the isolation device 412. In other embodiments, the delay circuit 450 may be fabricated on a common integrated chip as the master device 420 (e.g., a microprocessor).

The master device 420 may include inputs and outputs coupled to respective inputs and outputs of the slave device 430 via data lines and the isolation device 412 of the communication channel 410. The data lines between the master device 420 and the slave device may include a slave select (SS) data line, a serial clock (SCLK) data line, a master-output-slave-input (MOSI) data line, and a master-input-slave-output (MISO) data line. A delayed clock (DSCLK) data line may be included between the master device 420 and the isolation device 412.

To communicate with the slave device 430, the master device 420 may send a slave select signal over the SS data line to select the slave device 430. In one embodiment, the slave device 430 may be selected in response to a logic low signal or a falling edge.

The master device 420 may generate and send a clock signal over the SCLK data line to the slave device 430. The clock signal SCLK may be used by the master device 420 and the slave device 430 as a reference to send and/or receive data over the MOSI and MISO data lines. For example, in each clock cycle of the clock signal SCLK, the master device 420 may send a bit of data to the slave device 430 over the MOSI data line and the slave device 430 may send a bit of data to the master device 420 over the MISO data line. The master device 420 and the slave device 430 may send data over the communication channel 410 on one transition (e.g., rising edge) of the clock and read data from the communication channel 410 on the opposite transition (e.g., falling edge) of the clock SCLK. In other embodiments, the same type of transitions (e.g., one of the rising and falling edges) may be used as a reference to send and receive data over the communication channel 410. As discussed in more detail above with reference to FIG. 1, the master device 420 may read the data from the communication channel 410 using the delayed clock DSCLK as the reference (e.g., using one of the rising and falling edges). Thus, the frequency of the clock signal SCLK may determine the bandwidth of the communication between the master device 420 and the slave device 430.

The isolation device 412 may provide an isolation barrier between the master device 420 and the slave device 430. The isolation barrier may define separate voltage domains for the master device 420 and the slave device 430, including separate voltage supplies and grounds. The isolators 414.1-414.4 may include one or more of transformers, capacitors, optoelectronic and magneto-resistive based isolation devices.

The isolation device 412 may provide a plurality of isolation channels between a first side of the isolation barrier and a second side of the isolation barrier formed by the isolators 414.1-414.4. The isolation device 412 may include a first set of connections on the first side of the isolation barrier formed by the isolators 414.1-414.4. The first set of connections may be used to receive and send signals to the master device 420. A second set of connections may be provided on the second side of the isolation barrier formed by the isolators 414.1-414.4. The second set of connections may be used for sending signals to the slave device 430 and receiving signals from the slave device 430. In the embodiment illustrated in FIG. 4, the isolators 414.1-414.4 may support unidirectional communication between the first side of the isolation barrier and the second side of the isolation barrier. Each of the data lines may be coupled to a separate isolator 414.1-414.4. Other embodiments may include bidirectional communication (not shown in FIG. 4) over one or more isolation channels. While not shown in FIG. 4, the isolation device 412 may include circuitry to encode and/or decode signals transferred across the isolation barrier. Each isolator 414.1-414.4 may include an encoder on one side and a decoder on the other side of the isolation barrier.

The delay circuit 450 may provide the delay based on the parameters of the isolation device 412. For example, the delay produced by the delay circuit 450 may be set to at least the round trip propagation delay due to the isolation device 412. The delay provided by the delay circuit 450 may be preset based on the characteristics of the isolation device 412 during production testing. In other embodiments, the delay of the delay circuit 450 may be set based on a control signal CTRL provided by the isolation device 412 and/or the master device 420. The control signal CTRL may provide requests to adjust the delay based on the operating parameter or changes in the system. In other embodiments, the control signal CTRL may provide the operating parameters (e.g., voltage and/or temperature) or changes in the system and the delay circuit 450 using this information may adjust the delay of the delayed clock signal DSCLK.

In other embodiments, the control signal CTRL provided by the isolation device 412 may send information stored in the isolation device 412 regarding the amount of the delay that should be generated by the delay circuit 450 or the amount of propagation delay caused by the isolation device 412. Such information may be stored in the isolation device 412 by the manufacturer, for example, at the time the isolation device 412 is manufactured or tested.

While the above embodiments were discussed with reference to SPI communication, the principals of the above embodiments may be applied to other types of communications over an isolation barrier. For example, the above embodiments may be used for any parallel bus communication using an isolation barrier. In addition, while the above embodiments are discussed with reference to a four wire system, the principals may be applied to a three wire or a two wire systems. For example, in a three wire system the slave select data line may be omitted. In a two wire system, the clock may be provided over one channel to the slave device and the slave device may provide data to the master device over the second channel. In other embodiments, the second channel may be a bidirectional channel allowing the master device to send data to the slave device and the slave device to send data to the master device.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A system, comprising:
a plurality of isolators to transfer data signals across an isolation barrier, one of the signals including a clock signal; and
a delay circuit receiving the clock signal from one of the plurality of isolators and providing a delayed clock signal that lags the clock signal by an amount compensating for a round-trip of data across the isolation barrier.

2. The system of claim 1, wherein the delayed clock signal lags the clock signal by at least a propagation delay of two isolators.

3. The system of claim 1, wherein the delayed clock signal lags the clock signal by at least a propagation delay of an isolator providing data in a forward direction across the isolation barrier and a propagation delay of an isolator providing data in a reverse direction across the isolation barrier.

4. The system of claim 1, wherein the delay circuit and the plurality of isolators are fabricated on a common integrated chip.

5. The system of claim 1, wherein a first portion of the plurality of isolators transfer data signals in a first direction across the isolation barrier, and a remaining portion of the plurality of isolators transfer data in a second direction across the isolation barrier.

6. The system of claim 5, wherein:
the clock signal and data from a master device to a slave device are sent in the first direction; and
data from the slave device to the master device is sent in the second direction.

7. The system of claim 5, wherein the clock signal is sent in the first direction and the delayed clock signal is used as a reference to read data signals sent in the second direction.

8. The system of claim 1, wherein:
the clock signal is provided on a first side of the isolation barrier to be transmitted by one of the isolators to a second side of the isolation barrier; and
the delay circuit receives the clock signal on the first side of the isolation barrier.

9. The system of claim 1, wherein the delay circuit adjusts a delay of the delayed clock signal based on variations in the system.

10. The system of claim 1, wherein the delay circuit adjusts the delay of the delayed clock signal based on temperature variations of the system.

11. The system of claim 1, wherein the delay circuit adjusts a delay of the delayed clock signal based on at least one of a power supply voltage on a first side of the isolation barrier and a power supply voltage on a second side of the isolation barrier.

12. A system for compensating communications across an isolation barrier between two devices communicating with one another, comprising:
an isolation device including a plurality of isolation channels to transfer data signals across an isolation barrier between the two devices; and
a compensation circuit that receives a clock signal and uses the clock signal to compensate for a round-trip of data across the isolation barrier.

13. The system of claim 12, wherein:
the isolation device receives data and a clock signal to be sent over one of the isolation channels to a slave device; and
the isolation device sends a delayed clock signal generated by the compensation circuit to a master device and data received from the slave device over another one of the isolation channels.

14. The system of claim 12, wherein:
a master device provides the clock signal to be sent over one of the isolation channels to a slave device;
the slave device sends data to the master device over another isolation channel based on the clock signal received from the master device; and
the master device reads data sent by the slave device based on a delayed clock signal.

15. The system of claim 14, wherein the delayed clock signal lags the clock signal by at least a propagation delay of an isolator used to transfer data from the master device to the slave device and a propagation delay of an isolator used to transfer data from the slave device to the master device.

16. The system of claim 12, wherein a delayed clock signal generated by the compensation circuit lags the clock signal by at least a propagation delay of two isolators.

17. The system of claim 12, wherein the compensation circuit adjusts the lag of the delayed clock signal based on variations in the system.

18. The system of claim 12, wherein the compensation circuit adjusts the clock signal based on at least one of a power supply voltage on a first side of the isolation barrier and a power supply voltage on a second side of the isolation barrier.

19. The system of claim 12, wherein a delayed clock signal generated by the compensation circuit lags the clock signal by a portion of a total propagation delay of the system.

20. A method comprising:
transmitting data signals across an isolation barrier in a plurality of isolation channels,
transmitting a clock signal across one of the isolation channels; and
compensating for a round-trip of data across the isolation barrier.

21. The method of claim 20, wherein:
transmitting the data signals across the isolation barrier includes transmitting data from a master device to a slave device, transmitting data from the slave device to the master device, and transmitting the clock signal to the slave device;
the data from the master device to the slave device is transmitted based on the clock signal; and
the data from the slave device to the master device is transmitted based on the clock received by the slave device.

22. The method of claim 20, further comprising generating a delayed clock signal that lags the clock signal by at least a propagation delay of two isolators.

23. The method of claim 22, further comprising adjusting a delay of the delayed clock signal based on variations in the system.

24. The system of claim 1, wherein the delayed clock signal lags the clock signal by a propagation delay of two isolators plus a trimmed delay.

25. The system of claim 12, wherein the compensation circuit adjusts the clock signal by a propagation delay of two isolators plus a trimmed delay.

26. The system of claim 12, wherein the compensation circuit synchronizes the clock signal to the data signal returning from the round trip of the data.

* * * * *